United States Patent
Al-Momani et al.

(10) Patent No.: US 10,334,715 B2
(45) Date of Patent: Jun. 25, 2019

(54) SYSTEMS, METHODS AND DEVICES FOR A PACKAGE SECURING SYSTEM

(71) Applicant: INTEL CORPORATION, Santa Clara, CA (US)

(72) Inventors: Emad Al-Momani, Portland, OR (US); Srikanth Mothukuri, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 211 days.

(21) Appl. No.: 14/974,594

(22) Filed: Dec. 18, 2015

(65) Prior Publication Data

US 2017/0181263 A1 Jun. 22, 2017

(51) Int. Cl.
| | |
|---|---|
| *H05K 1/02* | (2006.01) |
| *H05K 7/20* | (2006.01) |
| *H01L 23/40* | (2006.01) |
| *G06F 1/20* | (2006.01) |
| *H05K 1/18* | (2006.01) |

(52) U.S. Cl.
CPC ............ *H05K 1/0203* (2013.01); *G06F 1/20* (2013.01); *H05K 1/181* (2013.01); *H01L 23/4006* (2013.01); *H05K 7/2039* (2013.01); *H05K 7/2049* (2013.01); *H05K 2201/066* (2013.01)

(58) Field of Classification Search
CPC ............... H05K 7/2039; H05K 7/2049; H05K 1/0203–021; G06F 1/20; H01L 23/4006; H01L 23/467

USPC ....... 361/704, 709, 710, 719; 165/80.1–80.3, 165/185; 257/712–713, 722
See application file for complete search history.

(56) References Cited

U.S. PATENT DOCUMENTS

| | | | | |
|---|---|---|---|---|
| 5,473,510 | A * | 12/1995 | Dozier, II | H01L 23/4006 174/548 |
| 5,880,930 | A * | 3/1999 | Wheaton | H05K 7/20409 165/80.3 |
| 5,883,782 | A * | 3/1999 | Thurston | H01L 23/4006 257/718 |
| 5,926,371 | A | 6/1999 | Dolbear | |
| 6,400,577 | B1 * | 6/2002 | Goodwin | H05K 7/1084 174/368 |
| 6,859,370 | B1 * | 2/2005 | Hsu | H01R 12/52 361/728 |
| 6,920,052 | B2 * | 7/2005 | Callahan | H01L 23/4006 165/80.3 |

(Continued)

OTHER PUBLICATIONS

PCT/US2016/059166, International Search Report and Written Opinion, dated Jan. 26, 2017, 14 pages.

*Primary Examiner* — Zachary Pape
(74) *Attorney, Agent, or Firm* — Stoel Rives LLP

(57) ABSTRACT

The present disclosure provides systems and methods for a package securing system including a top plate, an alignment frame, a gasket, and a back plate. The top plate comprises a thermal conductive member to transfer heat from a central processing unit (CPU) and secure the CPU to a ball grid array (BGA) socket and a printed circuit board (PCB). The alignment frame is configured to align a connection between the BGA socket and the PCB. The gasket is to seal the CPU, the BGA socket, and the alignment frame between the PCB and the top plate. The back plate is configured to couple with the top plate through the PCB.

16 Claims, 8 Drawing Sheets

(56) References Cited

U.S. PATENT DOCUMENTS

| | | | |
|---|---|---|---|
| 6,930,884 B2* | 8/2005 | Cromwell | H01L 23/4093 257/718 |
| 7,209,354 B2* | 4/2007 | Wu | H01L 23/4093 257/706 |
| 7,254,028 B2* | 8/2007 | Lee | H01L 23/4093 165/80.3 |
| 7,345,881 B2* | 3/2008 | Colbert | H01L 23/4006 165/185 |
| 7,787,252 B2* | 8/2010 | Mertol | H01L 23/055 257/706 |
| 7,957,148 B1* | 6/2011 | Gallarelli | H01L 23/32 165/80.3 |
| 8,119,926 B2* | 2/2012 | Murphy | B23K 1/0016 174/260 |
| 8,179,693 B2* | 5/2012 | Brodsky | H05K 7/1069 361/770 |
| 8,508,031 B2* | 8/2013 | Hayashi | H01L 23/4006 257/688 |
| 2004/0084764 A1* | 5/2004 | Ishimine | H01L 23/4006 257/706 |
| 2006/0202325 A1* | 9/2006 | Coico | H01L 23/4006 257/718 |
| 2008/0253098 A1 | 10/2008 | Liu | |
| 2011/0180809 A1* | 7/2011 | Hino | H01L 23/3121 257/77 |
| 2013/0280944 A1 | 10/2013 | Grice et al. | |
| 2014/0162473 A1 | 6/2014 | Aoki et al. | |

* cited by examiner

SYSTEMS, METHODS AND DEVICES FOR A PACKAGE SECURING SYSTEM

TECHNICAL FIELD

The present disclosure relates to a package securing system. In particular, the present disclosure relates to systems and methods for package securing systems for securing a package coupled to a ball grid array (BGA) socket.

BACKGROUND

Electronic devices are trending toward thinner form factors. Reducing the size of the electronic devices can include reducing the sizes of the components in the electronic devices. One of the components of the electronic devices that can be reduced in size is the package securing system. The package securing system can be reduced by using a ball grid array (BGA) type package instead of r a pin grid array (PGA) type package.

DETAILED DESCRIPTION OF PREFERRED EMBODIMENTS

Figure 1:
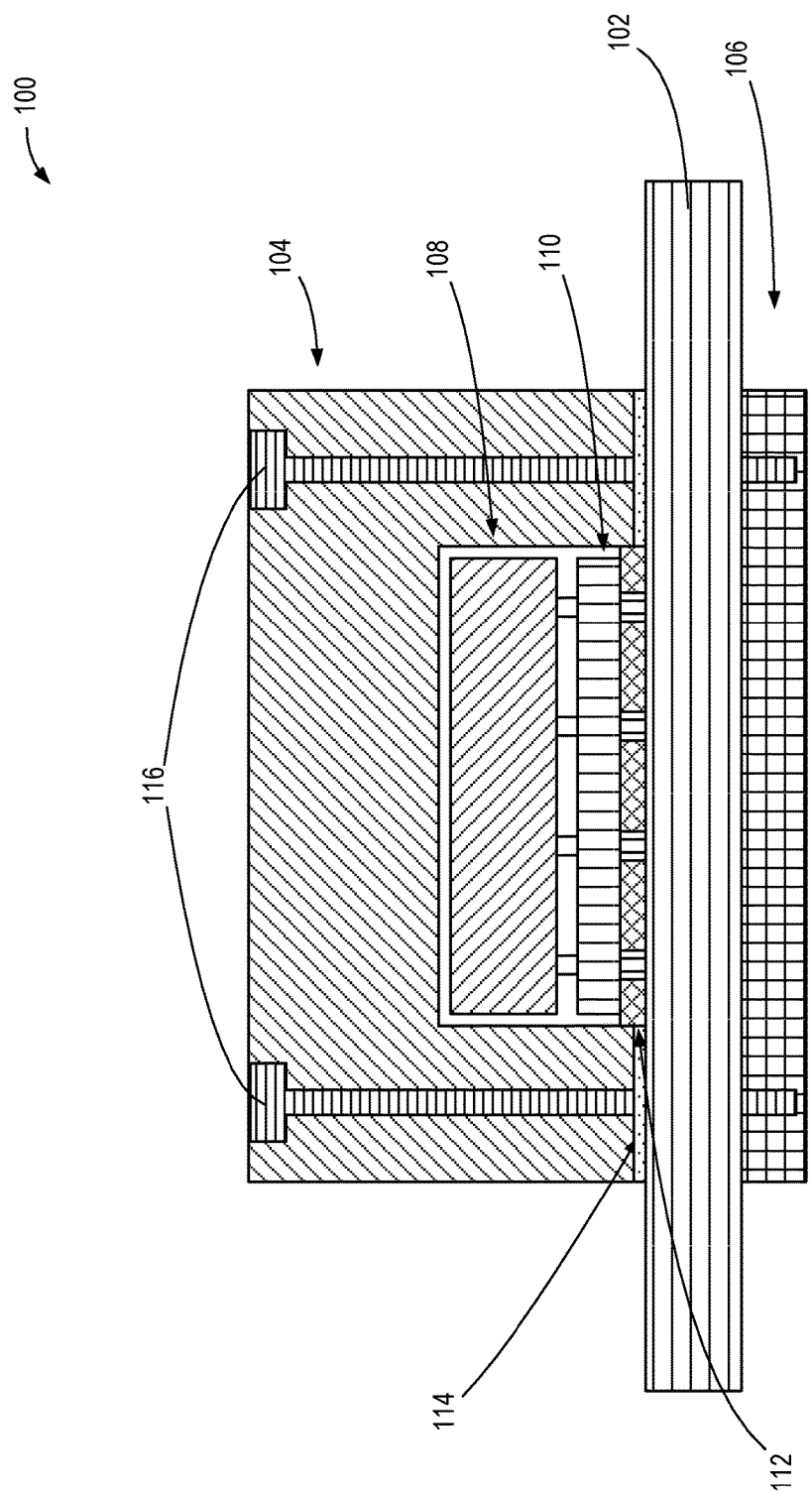
FIG. 1 is a system diagram for a package securing system according to one embodiment.

In one embodiment, a BGA package is secured to a printed circuit board (PCB) using a top plate and a back plate, the top plate comprising a thermal conductive member. The BGA package is sealed between the top plate and the PCB to prevent environmental pollutants from reaching the BGA package.

As used herein, the package can comprise hardware that can be coupled to the PCB. The CPU can comprise hardware with processing capabilities. The package can be a processing resource. For example, the package can be a central processing unit (CPU) and/or a graphical processing unit (GPU), among other types of hardware.

A package can be configured to be an land grid array (LGA) package, a PGA package, and/or a BGA package, among other types of packages. The use of a BGA can reduce the size of the electronic device. For example, the use of a BGA package in the electronic device can reduce the height of the electronic device as compared to the use of an LGA package and/or the PGA package. As such, embodiments described herein employ a BGA package in a package securing system. However, it is to be understood that the embodiments described herein can employ an LGA package.

Coupling a BGA package to a PCB in an electronic device without the use of a top plate and/or a back plate can include soldering the BGA package to the PCB. Soldering the BGA package to the PCB can include infrastructure to align the BGA package to the PCB without allowing the BGA package to shift during the soldering process. Acquiring the added infrastructure to solder the BGA package to the PCB can incur substantial resources.

Soldering the BGA package to the PCB can also include soldering the BGA package to the PCB in advance of the assembly of the computing device including the PCB and the BGA package. The soldering can occur a substantial amount of time before the assembly of the computing device. The ability to customize the BGA package included in the computing device at the time of assembly may be compromised due to the BGA package already being soldered at the time of assembly. As such, changes in orders of computing devices including different BGA packages than those already soldered to the PCB can include a delay of time required to solder the different BGA package to new PCBs which introduces a delay of time in the supply chain.

Soldering the BGA package to the PCB limits the ability to upsell. For example, if the BGA package is soldered to the PCB before the assembly of the computing device is initiated, then the BGA package is unable to be upgraded to if a customer decides to upgrade the BGA package in a purchased computing device. As such, a retailers ability to upgrade the BGA package in a purchase involving the soldering of the BGA package to the PCB is compromised.

Soldering the BGA package to the PCB can also limit the a modularity of the BGA package. That is, soldering the BGA package permanently couples the BGA package to the PCB thereby. As such, if a BGA package is damaged and it is desired to replace the BGA package, then a new BGA package and PCB may have to be procured due to the inability to replace the damaged BGA package. Furthermore, if it is desired to upgrade a BGA package that is soldered to the PCB, then a new BGA package and a new PCB may be installed rather than simply replacing the BGA package due to the permanent connection between the BGA package and the PCB.

In some embodiments, a top plate and a back plate are used to secure a BGA package to the PCB to reduce costs associated with soldering the BGA package to the PCB. A package securing system, according to certain embodiments, includes at least a top plate, an alignment frame, a gasket, and a back plate.

The top plate comprises a metal plate, a thermal conductive member to transfer heat from a BGA package and secure the package to a BGA socket and a PCB. The alignment frame connects a BGA socket to the PCB. The gasket seals the BGA package, the BGA socket, and the alignment frame between the PCB and the top plate. A back plate is coupled to the top plate to secure the BGA package, the BGA socket, and the alignment frame.

Reference is now made to the figures in which like reference numerals refer to like elements. For clarity, the first digit of a reference numeral indicates the figure number in which the corresponding element is first used. In the following description, numerous specific details are provided for a thorough understanding of the embodiments disclosed herein. However, those skilled in the art will recognize that the embodiments described herein can be practiced without one or more of the specific details, or with other methods, components, or materials. Further, in some cases, well-known structures, materials, or operations are not shown or described in detail in order to avoid obscuring aspects of the embodiments. Furthermore, the described features, structures, or characteristics may be combined in any suitable manner in one or more embodiments.

FIG. 1 is a system diagram for a package securing system 100 according to one embodiment. The package securing system 100 includes a PCB 102, a top plate 104, a back plate 106, a BGA package 108, a BGA socket 110, an alignment frame 112, a gasket 114, and a plurality of rods 116.

The PCB 102 mechanically supports electronic connections between components of an electronic device using conductive tracks, pads, and other features etched from copper sheets laminated onto a non-conductive substrate. For example, the PCB 102 supports an electronic connection between a package and memory via a plurality of pads etched onto a non-conductive substrate. As such, coupling the BGA package 108 to the PCB 102 includes coupling the BGA package 108 to the PCB 102 via a plurality of pads.

The top plate 104 includes a metal plate, a thermal conductive member, and a plurality of holes for coupling the top plate 104 to the back plate 106. The top plate 104 can serve a number of functions. For example, the top plate 104 can secure the BGA package 108, the BGA socket 110, and the alignment frame 112 to the PCB 102, transfer heat from the BGA package 108 via the thermal conductive member, and seal the BGA package 108 to the PCB 102, among other functions. The top plate 104 is further described in FIG. 6. In some embodiments, the alignment frame 112 can be secured to the PCB 102 via an adhesive force such as by glue or a similar adhesive component.

The back plate 106 includes a metal plate, a number of raised sections, and a plurality of holes for coupling the back plate 106 to the top plate 104. The plurality of holes of the back plate 106 are aligned consistently with a plurality of holes of the top plate 104 and a plurality of holes of the PCB 102 allowing for the plurality of rods 116 to traverse the number of holes to secure the back plate 106 to the top plate 104. The number of raised sections provides strength to the back plate 106 to keep the height of the back plate 106 at a minimum while still providing, with the top plate 104, a large force needed to maintain an electronic connection between the BGA package 108 and the PCB 102. The back plate 106 is further described in FIGS. 7 and 8.

The BGA package 108 includes a plurality of pads. The plurality of pads can solder balls that are used to couple the BGA package 108 to the PCB 102 via a number of copper pads of the PCB 102. The layout of the copper pads of the PCB 102 matches the layout of the plurality of pads of the BGA package 108 allowing the BGA package 108 to align to the PCB 102. In a number of examples, the layout of the pads of the BGA package 108 is aligned to match the layout of pads of the BGA socket 110 instead of the PCB 102. The BGA package 108 is further described in FIG. 5.

The BGA socket 110 couples the BGA package 108 to the PCB 102. The BGA socket 110 includes a number of pads on multiple faces of the BGA socket 110. For example, the BGA socket 110 includes a first number of pads on a first face to receive the BGA package 108 and a second number of pads on a second face to connect to the PCB 102. In a number of embodiments, the first number of pads and the second number of pads have a same layout or a different layout. For example, the first layout of the first number of pads is configured to connect the BGA socket 110 to the BGA package 108 while the layout of the second number of pads is configured to connect the BGA socket 110 to the PCB 102. The first layout can be the same as the second layout, or the first layout can be different from the second layout. The BGA socket 110 is further described in FIG. 4.

The alignment frame 112 aligns the pads of the BGA socket 110 to the copper pads of the PCB 102. The alignment frame 112 can be a stencil. For example, the alignment frame 112 can be a Kapton® stencil and/or a flame retardant 4 (FR4) stencil, among other types of stencils. The alignment frame 112 is further described in FIG. 2.

The gasket 114 seals the BGA package 108, the BGA socket 110, and the alignment frame 112 between the top plate 104 and the PCB 102. The gasket 114 is part of the top plate 104 and/or can be separate from the top plate 104. That is, the gasket 114 can be permanently attached to the top plate 104 or can be independent from the top plate 104. The gasket 114 comprises a rubber and/or other material capable of providing a seal impermeable to moisture, gases, salt, and/or dust among other environmental pollutants. The gasket 114 can be shaped to coincide with the lip of the top plate 104 and/or to accommodate the alignment frame 112.

In some embodiments, the gasket 114 is not used. That is, the top plate 104 can be coupled to the back plate 106 without the use of the gasket 114. Omitting the use of the gasket 114 can expose the BGA package 108 to environmental pollutants.

The plurality of rods 116 are a plurality of screws that have a thread designed to mate with an internal thread of the back plate 106. In some embodiments, threaded inserts can be press fitted into the back plate 106 in case the thickness of the back plate 106 is not capable of providing backing for a number of threads such that the plurality of rods 116 are able to screw into the back plate 106. The plurality of rods 116, for example, include two or four rods among other number of rods.

Figure 2:
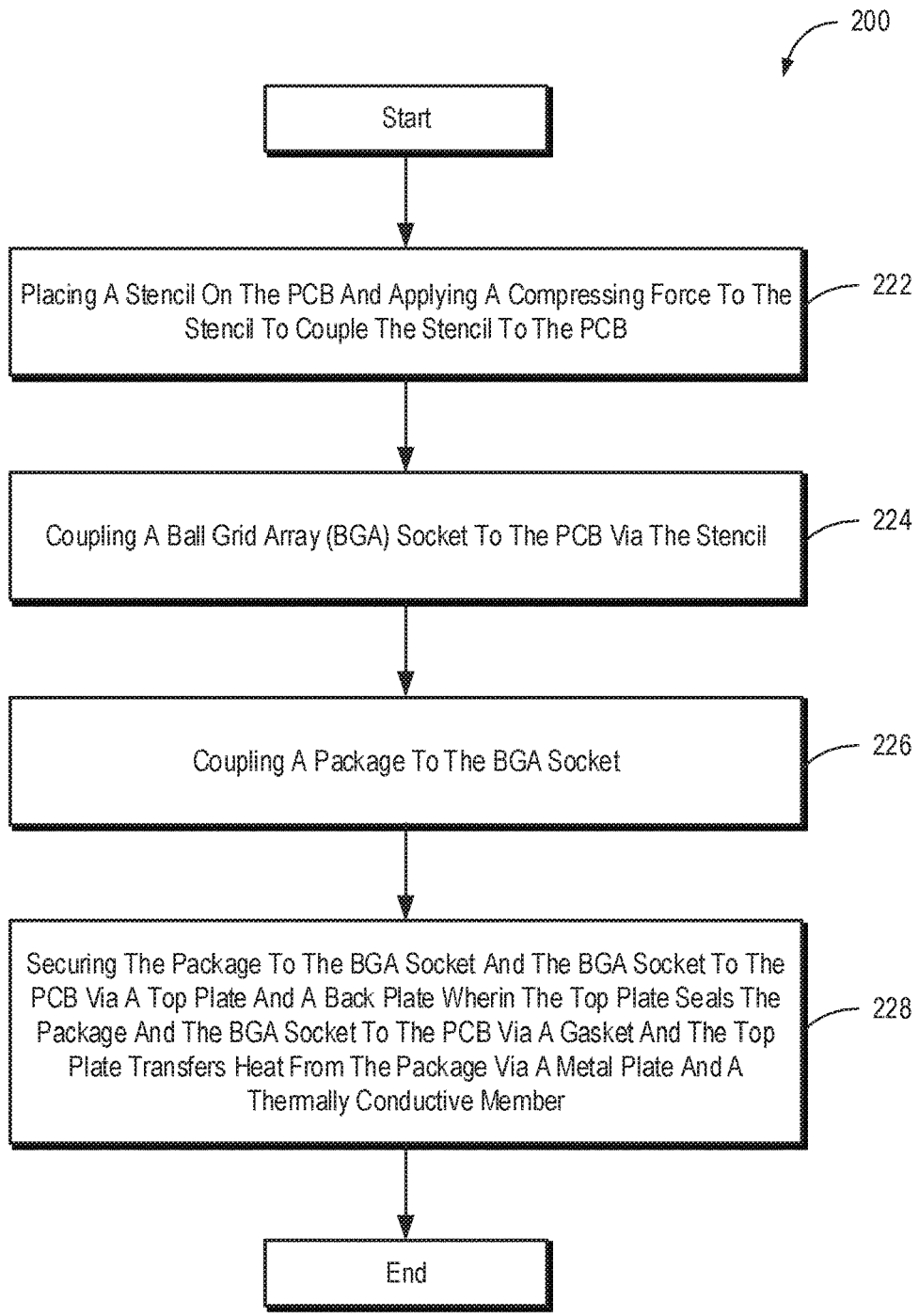
FIG. 2 is a flowchart of a method for securing a package using a package securing system according to one embodiment.
Figure 3:
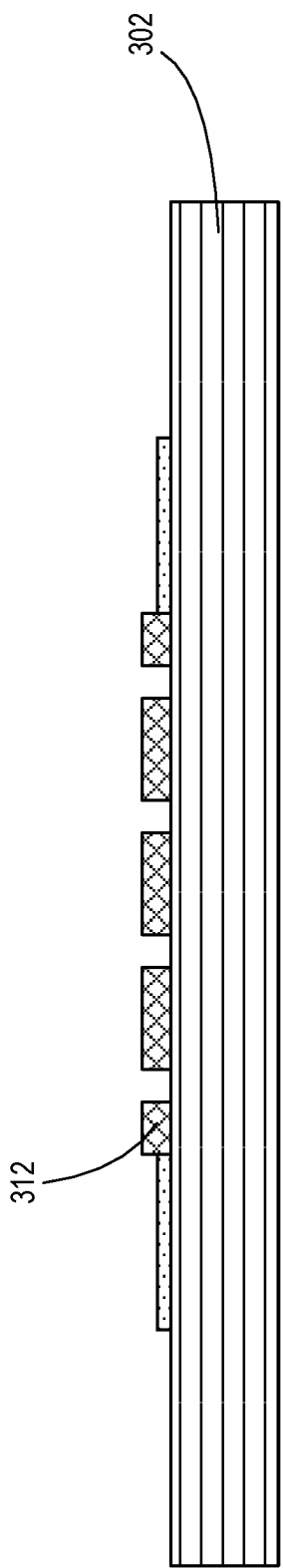
FIG. 3 is a system diagram for a package securing system including an alignment frame according to one embodiment.

FIG. 2 is a flowchart of a method 200 for securing a package using a package securing system according to one embodiment. The method 200 includes placing 222 a stencil on a PCB and applying a compression force to the stencil to couple the stencil to the PCB. FIG. 3 shows the stencil after the stencil is placed and pressed onto the PCB. In some embodiments, the stencil can be glued to the PCB.

The stencil can have a height up to 4 mm. In some embodiments, the height of the stencil can be dependent on the height of the socket column. The height of the socket column can include a stencil and/or the package. The stencil is shorter than the column height when the column is in a compressed state. A compressed state occurs when the package is secured to the PCB via the top plate and/or the back plate.

The stencil has a number of perforations. The perforations align with a number of pads of the PCB. The stencil covers the spaces between the pads of the PCB and exposes the pads of the PCB. A compression force can be applied to the stencil via a press. The dimensions of the stencil match the dimensions of the BGA socket.

Figure 4:
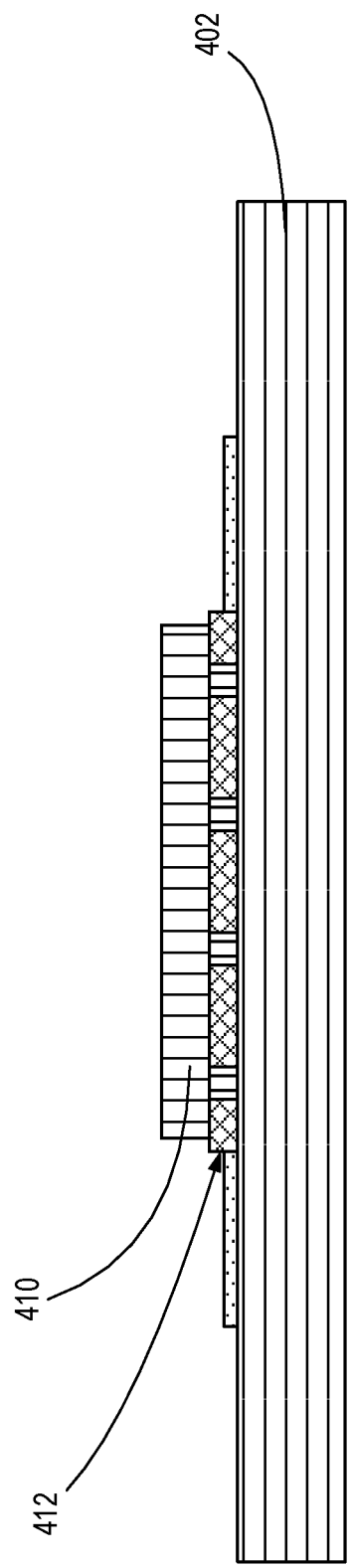
FIG. 4 is a system diagram for a package securing system including a ball grid array socket according to one embodiment.

The method 200 in FIG. 2 further includes coupling 224 a BGA socket to the PCB via the stencil. That is, the stencil guides the placement of the BGA socket to align the pads of the BGA socket with the pads of the PCB. The stencil prevents the movement of the BGA socket once the BGA socket is placed on the stencil. FIG. 4 shows the BGA socket on the stencil. The stencil has a height no greater than 1.3 mm. In some application, the stencil can have a height that is greater than 1.3 mm. For example, if the embodiments described herein are implemented in a desktop computing environment, then the stencil can have a height that is greater than 1.3 mm.

Figure 5:
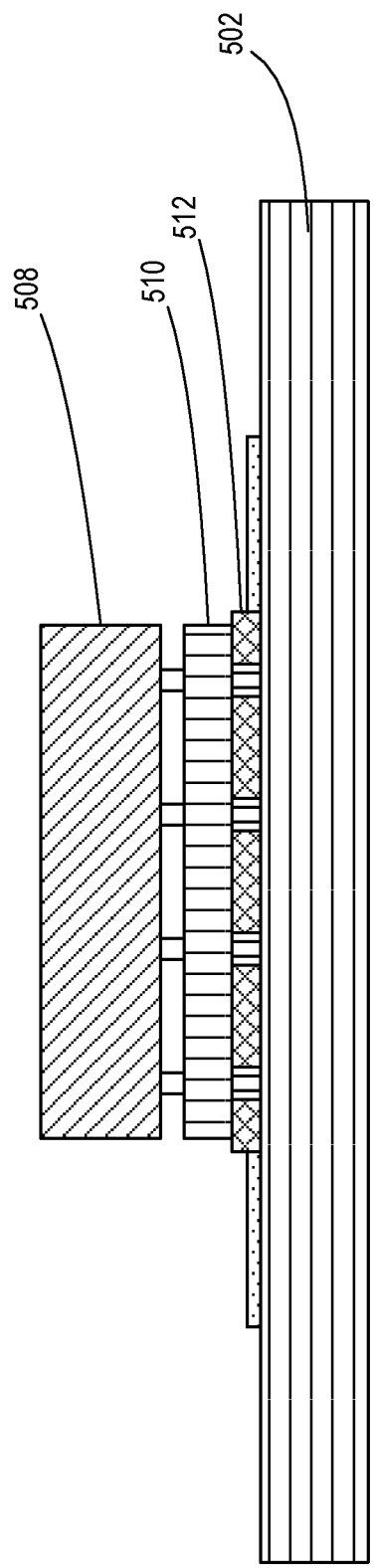
FIG. 5 is a system diagram for a package securing system including a package according to one embodiment.

The method 200 in FIG. 2 further includes coupling 226 the package to the BGA socket. The BGA package is coupled to the PCB through the BGA socket. FIG. 5 shows the BGA package after the BGA package is placed on the BGA socket.

The method 200 further includes securing 228 the package to the BGA socket and the BGA socket to the PCB via a top plate and a back plate. The top plate seals the package and the BGA socket to the PCB via a gasket. The top plate transfers heat from the BGA package to a thermal conductive member, and the thermal conductive member transfers heat from the top plate. The top plate has a height no greater than 1.8 mm. The bottom plate has a height no greater than 0.8 mm excluding a plurality of raised sections. In some embodiments, the bottom plate has a height no greater than 0.8 mm including a plurality of raised sections. FIG. 1 shows the top plate and the bottom plate securing the BGA package, the BGA socket, and the stencil.

In some embodiments, the height of the top plate can be greater than 1.8 mm and/or the height of the bottom plate can be greater than 0.8 mm. For example, if the embodiments described herein are implemented in application where there is a greater height allowance for the top plate and the bottom plate than 1.8 mm and 0.8 mm, respectively, then the top plate and/or the bottom plate can have a height that is greater than those described herein.

FIG. 3 is a system diagram for a package securing system including an alignment frame 312 according to one embodiment. The alignment frame 312 can be a zero keep out zone (KOZ) alignment mechanism. In some embodiments, the alignment frame 312 is adhered to a PCB 302.

FIG. 4 is a system diagram for a package securing system including a BGA socket 410 according to one embodiment. FIG. 4 shows the pads of the BGA socket 410 making contact with a PCB 402 via a number of perforations in an alignment frame 412.

As previously discussed, the dimensions of the alignment frame 412 match the dimensions of the BGA socket 410. For example, the dimensions of the alignment frame 412 are the same dimensions as the dimensions of the BGA socket 410. In some embodiments, the dimensions of the alignment frame 412 are larger or smaller than the dimensions of the BGA socket 410. The shape of the alignment frame 412 is a same shape as the shape of the BGA socket 410 even if the dimensions of the alignment frame 412 are not the same dimensions as the dimensions of the BGA socket 410.

FIG. 5 is a system diagram for a package securing system including a BGA package 508 according to one embodiment. The BGA package 508 is shown as being coupled to a BGA socket 510 which in turn is coupled to a PCB 502 via an alignment frame 512.

In some embodiments, the BGA package 508 is aligned with the BGA socket 510 by an alignment frame (not shown). The dimensions of the BGA package 508 are the same dimensions as either one of the BGA socket 510 and/or the alignment frame 512. In some embodiments, the shape of the BGA package 508 is the same shape as the shape of either of the BGA socket 510 and/or the alignment frame 512.

Figure 6:
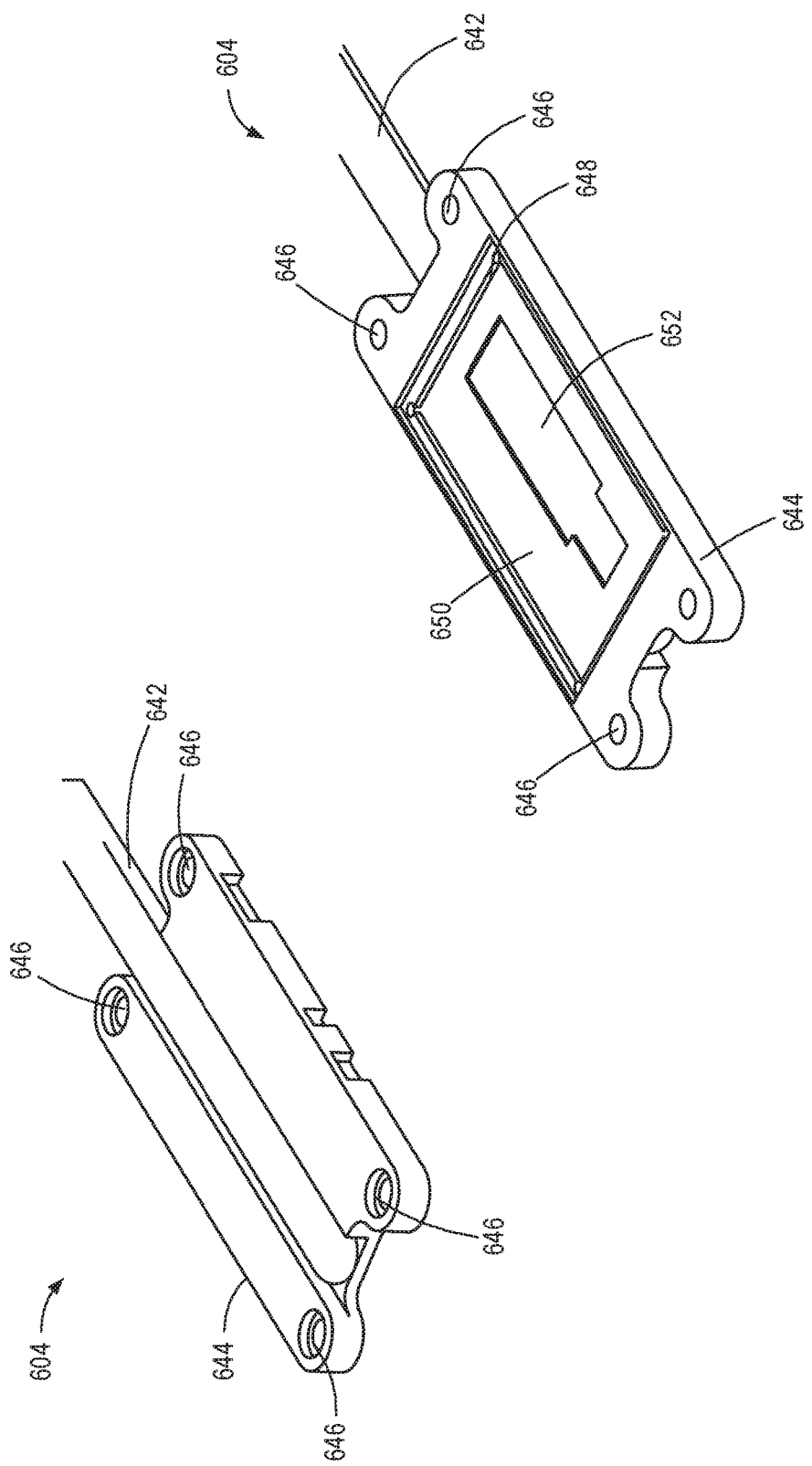
FIG. 6 graphically illustrates a top plate according to one embodiment.

FIG. 6 graphically illustrates a top plate 604 according to one embodiment. The top plate 604 includes a metal plate 644 and a thermal conductive member 642. The top plate 604 also includes a plurality of holes 646.

The metal plate 644 and the thermal conductive member 642 can be a same piece or separate pieces of metal. For example, the metal plate 644 and the thermal conductive member 642 can have originated from a same piece of metal, and/or the metal plate 644 and the thermal conductive member 642 can have originated as different pieces of metal.

If the metal plate 644 and the thermal conductive member 642 originated from different pieces of metal, then the metal plate 644 and thermal conductive member 642 are comprised of different types of metal. If the metal plate 644 and the thermal conductive member 642 originated from a same piece of metal, then the metal plate 644 and the thermal conductive member 642 are comprised of a same type of metal. For example, the metal plate 644 and/or the thermal conductive member 642 can both be made out of copper, among other types of metal.

The metal plate 644 and/or the thermal conductive member 642 can be permanently coupled and/or can be separable. In some embodiments, the collective height of the metal plate 644 and the thermal conductive member 642 is a same height as the height of the metal plate 644. The metal plate 644 has a recession in which the thermal conductive member 642 can reside such that the thermal conductive member 642 does not protrude past the height of the metal plate 644. The metal plate 644 has a thickness sufficient to enable 80 pounds of pressure to be applied to the BGA package using the back plate.

The metal plate 644 has a plurality of grooves (e.g., grooves 650 and 652) to enclose a BGA package. The plurality of grooves are tailored to the dimensions and sizes of the BGA package, the BGA socket, and/or the alignment frame. For example, at least the groove 650 from the plurality of grooves is tailored to enclose the BGA package.

The metal plate 644 is configured to make contact with the BGA package. In some embodiments, the BGA package may have a die exposed. In such examples, the metal plate 644 can include the groove 652 to clear the die while still making contact with the BGA package. Although the metal plate 644 may contact the BGA package on a face of the BGA package, the metal plate 644 may not contact the BGA package on the sides of the BGA package allowing the alignment of the BGA package to the PCB board to be guided by the alignment frame and not the metal plate 644.

FIG. 6 shows a gasket 648 being permanently coupled to the metal plate 644. The gasket 648 is coupled to a lip of the metal plate 644 such that the gasket 648 does not make contact with the plurality of grooves.

Figure 7:
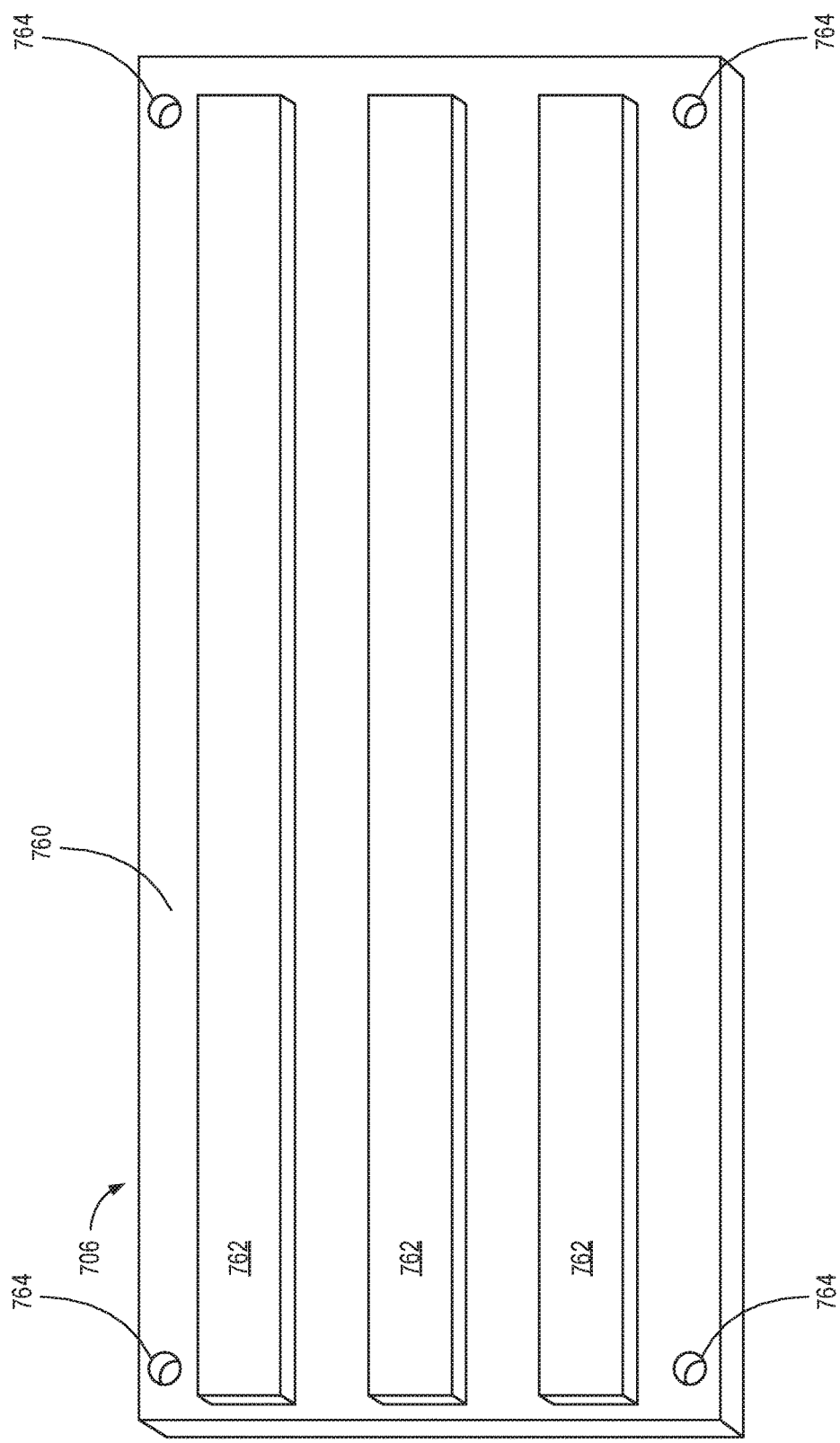
FIG. 7 graphically illustrates a back plate according to one embodiment.

FIG. 7 graphically illustrates a back plate 706 according to one embodiment. The back plate 706 is comprised of a metal plate 760 and a plurality of raised sections 762. The metal plate 760 has plurality of holes 764. The metal plate 760 is smooth on a first face of the metal plate 760 and has a plurality of raised sections 762 on a second face of the metal plate 760. The plurality of raised sections 762 rise from the metal plate 760.

The plurality of raised sections 762 conform to a number of molds. The number of molds can include stripes, waves, and/or different shapes. In some embodiments, the plurality of raised sections 762 provide strength to the metal plate 760 such that the metal plate 760 withstands at least 80 pounds of pressure without damaging the metal plate 760. The pressure that the metal plate 760 is able to withstand can be proportional to the configuration of raised sections 762. That is, as the quantity of raised sections included in the metal plate 760 increases so does the pressure that the metal plate 760 is able to withstand. In some embodiments, the metal plate 760 can be configured to withstand less than 80 pounds of pressure and still employ the embodiments described herein.

The holes 764 are threaded to receive a plurality of rods. The holes 764 allow a rod to completely penetrate the metal plate 760 and/or partially penetrate the metal plate 760. For example, the holes 764 allow a rod to enter from a first face and exit a second face of the metal plate 760, or the holes 764 can allow a rod to enter from a first face without allowing the rod to exit a second face.

In some embodiments, the back plate 706 makes contact with the PCB along a face of the back plate 706. For example, the back plate 706 can contact the PCB along the smooth section of the metal plate 760 and/or the face including the raised sections 762. If the back plate 706 contacts the PCB along the face including the raised sections 762, then the metal plate 760 is prevented from making contact with the PCB. Preventing the metal plate 760 from contacting the PCB allows space for a number of resistors to protrude from the PCB without having to further modify the metal plate 760 and/or the back plate 706. Orienting the back plate 706 such that the smooth section of the metal plate 760 makes contact with the PCB includes creating a number of grooves on the smooth section of the metal plate 760 to allow for clearance of the resisters coupled to the PCB. That is, a first face of the back plate 706 can have the raised sections 762 and a second face of the back plate 706 can have the number of grooves.

Figure 8:
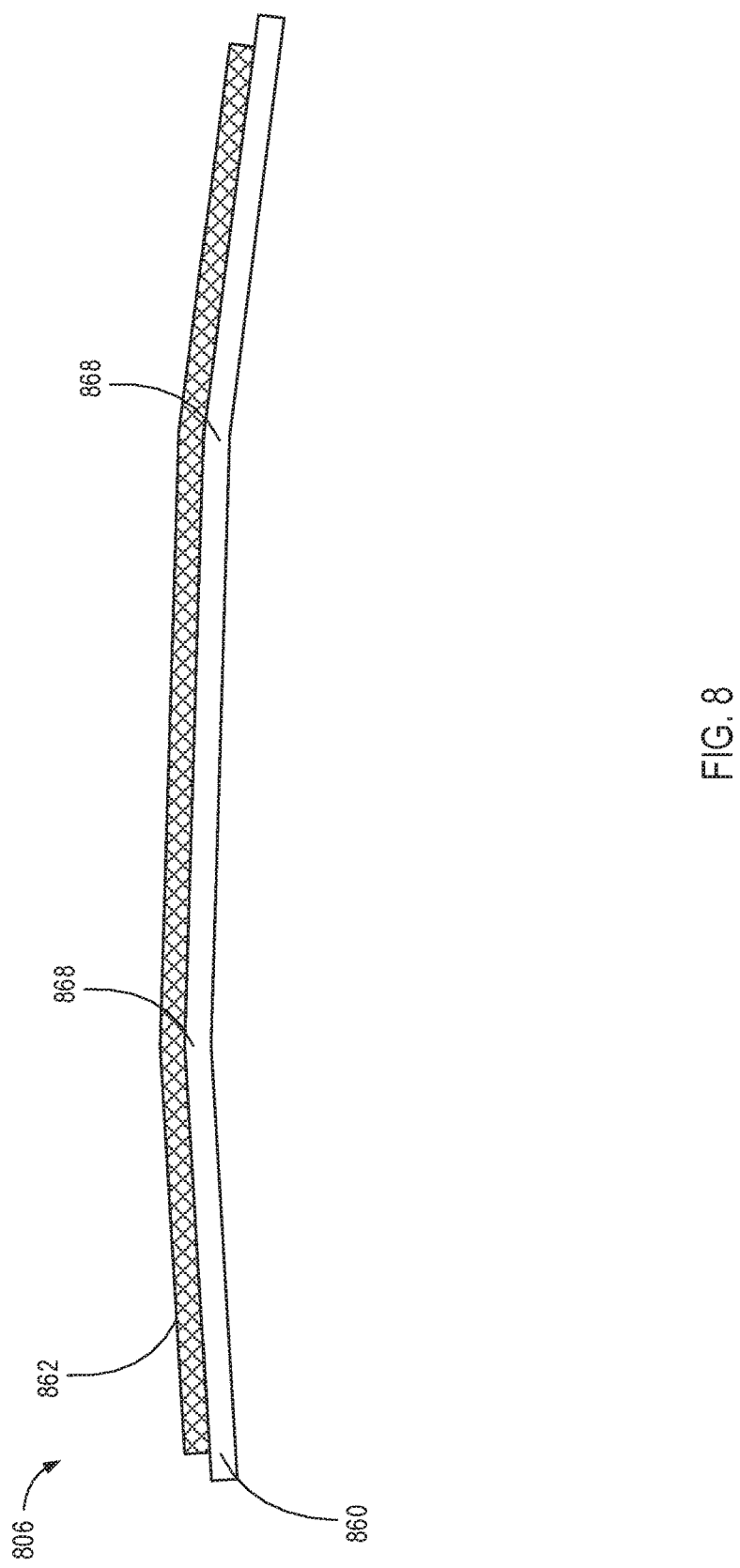
FIG. 8 graphically illustrates a back plate according to one embodiment.

FIG. 8 graphically illustrates a back plate 806 according to one embodiment. The back plate 806 shows a metal plate 860 and a number of raised sections 862. The back plate 806 is shown from a side view. In FIG. 8, the back plate 806 is oriented such that the back plate 806 contacts the PCB along a face of the back plate 806 that includes the number of raised sections 862.

The back plate 806 is concaved such that the ends of the back plate 806 protrude away from a plane along which the back plate 806 contacts the PCB. The protrusions initiate at least at two points 868 such that a first section of the raised sections 862 contacts the PCB and a second and third sections of the raised sections 862 do not contact the PCB. The divergence of the second and third sections from the first section along a plane on which the raised sections 862 contact the PCB can be 1 to 5 degrees. In a number of embodiments, the divergence can be greater than 5 degrees. The curvature of the back plate 806 can be configured according to any number of shapes. For example, the curvature of the back plate 806 can be configured to that of a circular shape, among other shapes.

The concave nature of the back plate 806 allows for the back plate 806 to have a spring action. Over the life of the back plate 806, the back plate 806 may relax such that the rods coupling the back plate 806 to the top plate may come loose. The concave nature of the back plate 806 allows for the back plate 806 to compensate for the relaxing of the back plate 806 such that the bolts do not come loose over the life of the back plate 806.

EXAMPLE EMBODIMENTS

Example 1, A package securing system, comprising a top plate comprising a thermal conductive member to transfer heat from a central processing unit (CPU) and secure the CPU to a ball grid array (BGA) socket and a printed circuit board (PCB). The package securing system also comprising an alignment frame to align a connection between the BGA socket and the PCB and a gasket to seal the CPU, the BGA socket, and the alignment frame between the PCB and the top plate. The package securing system also comprising a back plate to couple with the top plate through the PCB.

Example 2, the package securing system of example 1, further comprising a plurality of rods to fasten the top plate to the back plate via a plurality of holes in the top plate and the back plate.

Example 3, the package securing system as in example 1 or 2, wherein the alignment frame is a Kapton® stencil.

Example 4, the package securing system as in examples 1 or 2, wherein the alignment frame is a flame retardant 4 (FR4) stencil.

Example 5, the package securing system as in examples 1, 2, 3, or 4, wherein the alignment frame is no greater than 4 mm.

Example 6, the package securing system as in examples 1, 2, 3, or 4, wherein the alignment frame covers spaces between pads of the PCB and exposes the pads.

Example 7, the package securing system as in examples 1, 2, 3, or 4, wherein the alignment frame matches a plurality of dimensions of the BGA socket.

Example 8, a top plate for securing a package, comprising a metal plate to secure a package and transfer heat from the package, the metal plate including a package groove on a first face of the metal plate, the package groove to enclose the package and a plurality of holes for attaching the metal plate to a back plate through a printed circuit board (PCB). The top plate also comprising a thermal conductive member coupled to a second face of the metal plate, the thermal conductive member to transfer heat from the metal plate and a gasket attached to the first face of the metal plate, the gasket to seal the package between the metal plate and the PCB.

Example 9, the top plate of example 8, wherein the thermal conductive member and the metal plate are a single piece.

Example 10, the top plate of example 8, wherein the thermal conductive member and the metal plate are separate pieces.

Example 11, the top plate as in examples 8, 9, or 10, wherein the gasket protects the package from environmental contaminants.

Example 12, the top plate as in examples 8, 9, or 10, wherein the top plate measures up to 4.4 mm.

Example 13, the top plate as in examples 8, 9, or 10, wherein the metal plate and the thermal conductive member are made from different materials.

Example 14, the top plate as in examples 8, 9, or 10, wherein the metal plate and the thermal conductive member are made from a same material.

Example 15, a back plate, comprising a metal plate including a plurality of holes to attach a top plate to the metal plate, a plurality of raised sections on a first face of the metal plate to provide strength to the metal plate and a smooth second face of the metal plate, wherein the metal plate is concave along at least one of the first face and the smooth second face.

Example 16, the back plate of example 15, wherein the back plate is no greater than 0.8 mm excluding the plurality of raised sections.

Example 17, the back plate of example 15, wherein the back plate is no greater than 0.8 mm excluding the plurality of raised sections.

Example 18, the back plate as in examples 15, 16, or 17, wherein the first face of the metal plate contacts a printed circuit board (PCB).

Example 19, the back plate of example 18, wherein the plurality of raised sections prevent portions of the back plate from making contact with the PCB.

Example 20, the back plate as in examples 15, 16, or 17, wherein the smooth second face of the metal plate contacts a printed circuit board (PCB).

Example 21, the back plate as in examples 15, 16, or 17, wherein the back plate withstands at least 80 pounds of pressure.

Example 22, a method for connecting a package to a printed circuit board (PCB), the method comprising placing a stencil on the PCB, applying a compressing force to the stencil to couple the stencil to the PCB, coupling a ball grid array (BGA) socket to the PCB via the stencil, coupling a package to the BGA socket, and securing the package to the BGA socket and the BGA socket to the PCB via a top plate and a back plate wherein the top plate seals the package and the BGA socket to the PCB via a gasket and the top plate transfers heat from the package via a metal plate and a thermal conductive member.

Example 23, the method of example 22, wherein the compressing force is applied to the stencil using a press.

Example 24, a package securing system, comprising means for transferring heat from a central processing unit (CPU) via thermal conductive member and a top plate, means for securing the CPU to a ball grid array (BGA) socket and a printed circuit board (PCB) using the top plate, means for aligning a connection between the BGA socket and the PCB using an alignment frame, means for sealing the CPU, the BGA socket, and the alignment frame between the PCB and the top plate using a gasket, and means for coupling with the top plate through the PCB using a back plate.

Example 25, the package securing system of example 24, further comprising a plurality of rods to fasten the top plate to the back plate via a plurality of holes in the top plate and the back plate.

Example 26, the package securing system as in examples 24 or 25, wherein the alignment frame is a Kapton® stencil.

Example 27, the package securing system as in example 24 or 25, wherein the alignment frame is a flame retardant 4 (FR4) stencil.

Example 28, the package securing system as in examples 24, 25, 26, or 27, wherein the alignment frame is no greater than 4 mm.

Example 29, the package securing system as in examples 24, 25, 26, or 27, wherein the alignment frame covers spaces between pads of the PCB and exposes the pads.

Example 30, the package securing system as in examples 24, 25, 26, or 27, wherein the alignment frame matches a plurality of dimensions of the BGA socket.

Example 31, a top plate for securing a package, comprising means for securing a package using a metal plate, the metal plate comprising a package groove on a first face of the metal plate, the package groove to enclose the package and a plurality of holes for attaching the metal plate to a back plate through a printed circuit board (PCB). The top palate for securing the package also comprising means for and transfer heat from the package using a thermal conductive member, means for transferring heat from the metal plate using a thermal conductive member coupled to a second face of the metal plate, and means for sealing the package between the metal plate and the PCB using a gasket attached to the first face of the metal plate.

Example 32, the top plate of example 31, wherein the thermal conductive member and the metal plate are a single piece.

Example 33, the top plate of example 31, wherein the thermal conductive member and the metal plate are separate pieces.

Example 34, the top plate as in examples 31, 32, or 33, wherein the gasket protects the package from environmental contaminants.

Example 35, the top plate as in examples 31, 32, or 33, wherein the top plate measures up to 4.4 mm.

Example 36, the top plate as in examples 31, 32, or 33, wherein the metal plate and the thermal conductive member are made from different materials.

Example 37, the top plate as in examples 31, 32, or 33, wherein the metal plate and the thermal conductive member are made from a same material.

Example 38, a back plate, comprising means for attaching a top plate to the metal plate, means for providing strength to the metal plate on a first face, and a smooth second face of the metal plate, wherein the metal plate is concave along at least one of the first face and the smooth second face.

Example 39, the back plate of example 38, wherein the back plate is no greater than 0.8 mm excluding a plurality of raised sections on the first face.

Example 40, the back plate of example 38, wherein the back plate is no greater than 0.8 mm excluding a plurality of raised sections on the first face.

Example 41, the back plate as in example 38, 39, or 40, wherein the first face of the metal plate contacts a printed circuit board (PCB).

Example 42, the back plate of example 41, wherein the plurality of raised sections prevent portions of the back plate from making contact with the PCB.

Example 43, the back plate as in examples 38, 39, or 40, wherein the smooth second face of the metal plate contacts a printed circuit board (PCB).

Example 44, the back plate as in examples 38, 39, or 40, wherein the back plate withstands at least 80 pounds of pressure. The described features, operations, or characteristics may be arranged and designed in a wide variety of different configurations and/or combined in any suitable manner in one or more embodiments. Thus, the detailed description of the embodiments of the systems and methods is not intended to limit the scope of the disclosure, as claimed, but is merely representative of possible embodiments of the disclosure. In addition, it will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps, or by a combination of hardware, software, and/or firmware.

It will be understood by those having skill in the art that many changes may be made to the details of the above-described embodiments without departing from the underlying principles of the invention. The scope of the present invention should, therefore, be determined only by the following claims.

What is claimed is:

1. A package securing system, comprising:
   a top plate comprising a thermal conductive member to:
      transfer heat from a central processing unit (CPU); and
      secure the CPU to a ball grid array (BGA) socket and a printed circuit board (PCB);
   an alignment frame to align a connection between the BGA socket and the PCB;

a gasket between the top plate and the PCB, the gasket also being in contact with the alignment frame, the gasket configured to completely surround the CPU and the BGA socket between the PCB and the top plate to seal the CPU and the BGA socket from the environment; and a back plate to couple with the top plate through the PCB.

2. The package securing system of claim 1, further comprising a plurality of rods to fasten the top plate to the back plate via a plurality of holes in the top plate and the back plate.

3. The package securing system of claim 1, wherein the alignment frame includes a polyimide material.

4. The package securing system of claim 1, wherein the alignment frame is a flame retardant 4 (FR4) stencil.

5. The package securing system of claim 1, wherein the alignment frame covers spaces between pads of the PCB and exposes the pads of the PCB.

6. The package securing system of claim 5, wherein the alignment frame matches a plurality of dimensions of the BGA socket.

7. A top plate for securing a package, comprising:
a metal plate to secure a package and transfer heat from the package, the metal plate including:
  a package groove on a first face of the metal plate, the package groove to enclose the package; and
  a plurality of holes for attaching the metal plate to a back plate through a printed circuit board (PCB);
an alignment frame to align a connection between the package and the PCB;
a thermal conductive member coupled to a second face of the metal plate, the thermal conductive member to transfer heat from the metal plate; and
a gasket attached to the first face of the metal plate and contacting the alignment frame, the gasket to completely surround the package between the metal plate and the PCB to seal the package from the environment.

8. The top plate of claim 7, wherein the thermal conductive member and the metal plate are a single piece.

9. The top plate of claim 7, wherein the thermal conductive member and the metal plate are separate pieces.

10. The top plate of claim 7, wherein the top plate measures up to 4.4 mm in height.

11. The top plate of claim 7, wherein the metal plate and the thermal conductive member are made from different materials.

12. The top plate of claim 7, wherein the metal plate and the thermal conductive member are made from a same material.

13. A back plate, comprising:
a metal plate including:
  a first face;
  a smooth second face on an opposite side of the metal plate from the first face;
  a plurality of holes to directly attach a top plate to the metal plate by receiving a plurality of rods coupled to the top plate;
  a plurality of raised sections on the first face of the metal plate to provide strength to the metal plate;
wherein:
  the metal plate is concave along at least one of the first face or the smooth second face; and
  at least a portion of the first face is in contact with a printed circuit board (PCB), the at least a portion of the first face comprising at least a portion of one of the plurality of raised sections.

14. The back plate of claim 13, wherein the back plate is no greater than 0.8 mm in height excluding the plurality of raised sections.

15. The back plate of claim 13, wherein the plurality of raised sections prevent portions of the back plate from making contact with the PCB.

16. The back plate of claim 13, wherein the back plate withstands at least 80 pounds of pressure.

* * * * *